(12) United States Patent
Marak et al.

(10) Patent No.: US 7,321,241 B1
(45) Date of Patent: Jan. 22, 2008

(54) BIDIRECTIONAL BUFFER WITH SLEW RATE CONTROL AND METHOD OF BIDIRECTIONALLY TRANSMITTING SIGNALS WITH SLEW RATE CONTROL

(75) Inventors: Chadwick N. Marak, San Jose, CA (US); Jeffrey C. Dunnihoo, Bertram, TX (US); Adam J. Whitworth, Los Altos, CA (US)

(73) Assignee: California Micro Devices, Milpitas, CA (US)

( * ) Notice: Subject to any disclaimer, the term of this patent is extended or adjusted under 35 U.S.C. 154(b) by 16 days.

(21) Appl. No.: 11/424,535

(22) Filed: Jun. 15, 2006

(51) Int. Cl.
 *H03K 19/0175* (2006.01)
(52) U.S. Cl. .......................................... 326/83; 326/26

(58) Field of Classification Search ............ 326/82–87, 326/26, 27
See application file for complete search history.

(56) References Cited

U.S. PATENT DOCUMENTS

| | | | |
|---|---|---|---|
| 5,517,135 A * | 5/1996 | Young | 326/86 |
| 5,656,950 A * | 8/1997 | Duong et al. | 326/41 |
| 6,052,325 A | 4/2000 | Merritt | |
| 6,323,722 B1 | 11/2001 | Proebsting | |
| 6,329,839 B1 | 12/2001 | Pani et al. | |
| 7,239,174 B2 * | 7/2007 | Madurawe | 326/38 |

* cited by examiner

*Primary Examiner*—Don Le
(74) *Attorney, Agent, or Firm*—Pillsbury, Winthrop, Shaw, Pittman LLP

(57) ABSTRACT

The present invention is directed to bidirectional buffer with slew rate control in at least one direction. The present invention is also directed to a method of bidirectionally transmitting signals with slew rate control in at least one direction.

14 Claims, 3 Drawing Sheets

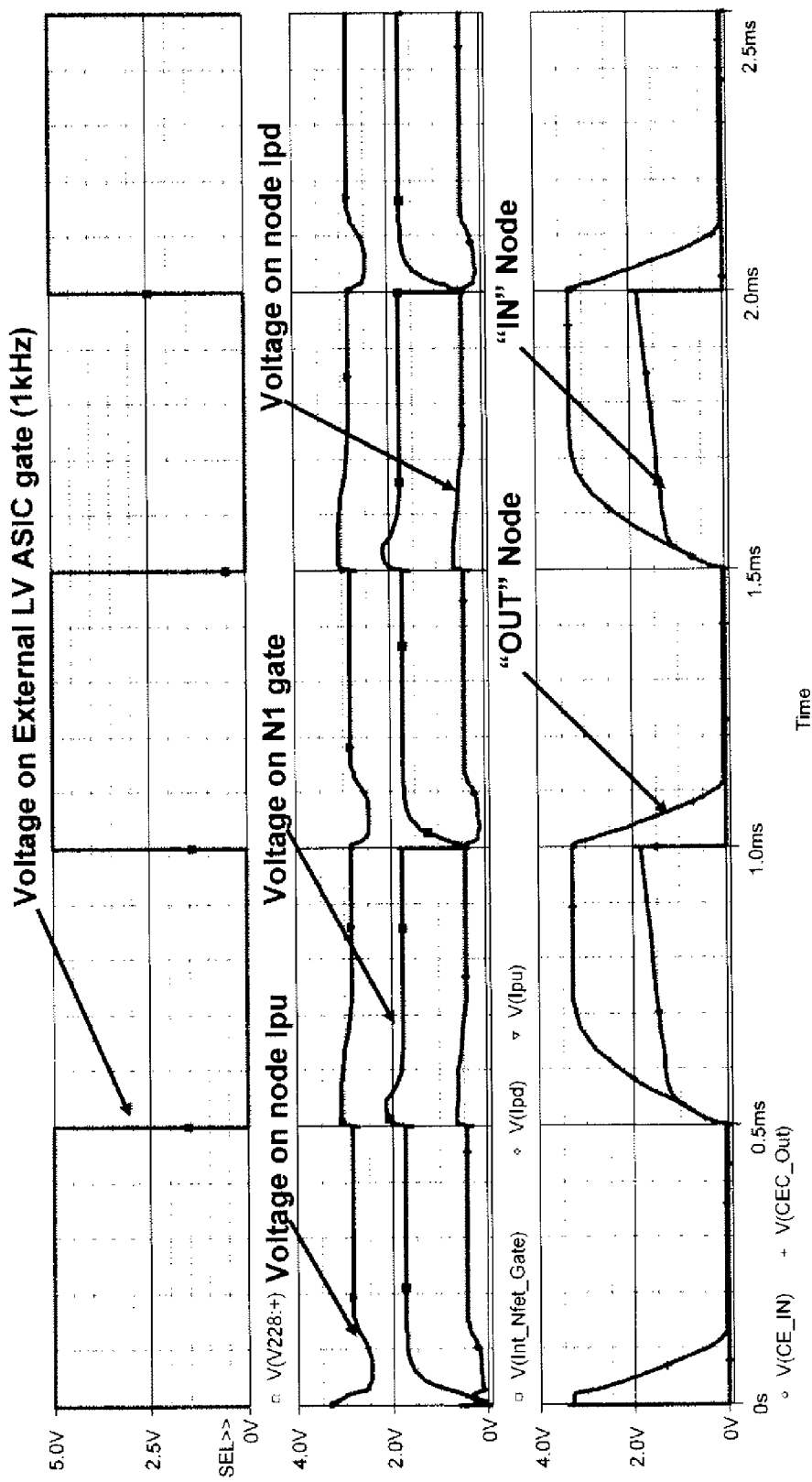

BIDIRECTIONAL BUFFER WITH SLEW RATE CONTROL AND METHOD OF BIDIRECTIONALLY TRANSMITTING SIGNALS WITH SLEW RATE CONTROL

FIELD OF THE INVENTION

The present invention relates to a bidirectional buffer with slew rate control and method of bidirectionally transmitting signals with slew rate control.

BACKGROUND

Bidirectional buffers are well known devices that allow the transmission of a signal through the buffer. There are many types of buffers, and various combinations of features. For buffers of the type described by the present invention, some conventional buffers are bidirectional, others are unidirectional; some conventional buffers have slew rate control, others do not.

As mentioned, certain bidirectional buffers also possess the ability to control the slew rate of the signal that is input thereto. Providing for slew rate control can allow one to maintain better overall control of the circuits, as changes in signal that has been buffered have more predictability.

Conventional bidirectional circuits that have slew rate control require, however, a directional control input in order to operate properly. While in certain circumstances this works fine, in others it does not.

What is desired is a bidirectional buffer with slew rate control in at least one direction, as well as a method of bidirectionally transmitting signals with slew rate control in at least one direction.

SUMMARY OF THE INVENTION

The present invention is directed to bidirectional buffer with slew rate control in at least one direction.

The present invention is also directed to a method of bidirectionally transmitting signals with slew rate control in at least one direction.

BRIEF DESCRIPTION OF THE DRAWINGS

The above and other aspects of the present invention will become readily apparent when reading the following detailed description taken in conjunction with the appended drawings in which:

FIGS. 3A-3C are timing diagrams of various signals input to, outfrom from, and created within the buffer according to the present invention.

DETAILED DESCRIPTION OF THE PREFERRED EMBODIMENTS

Figure 1:
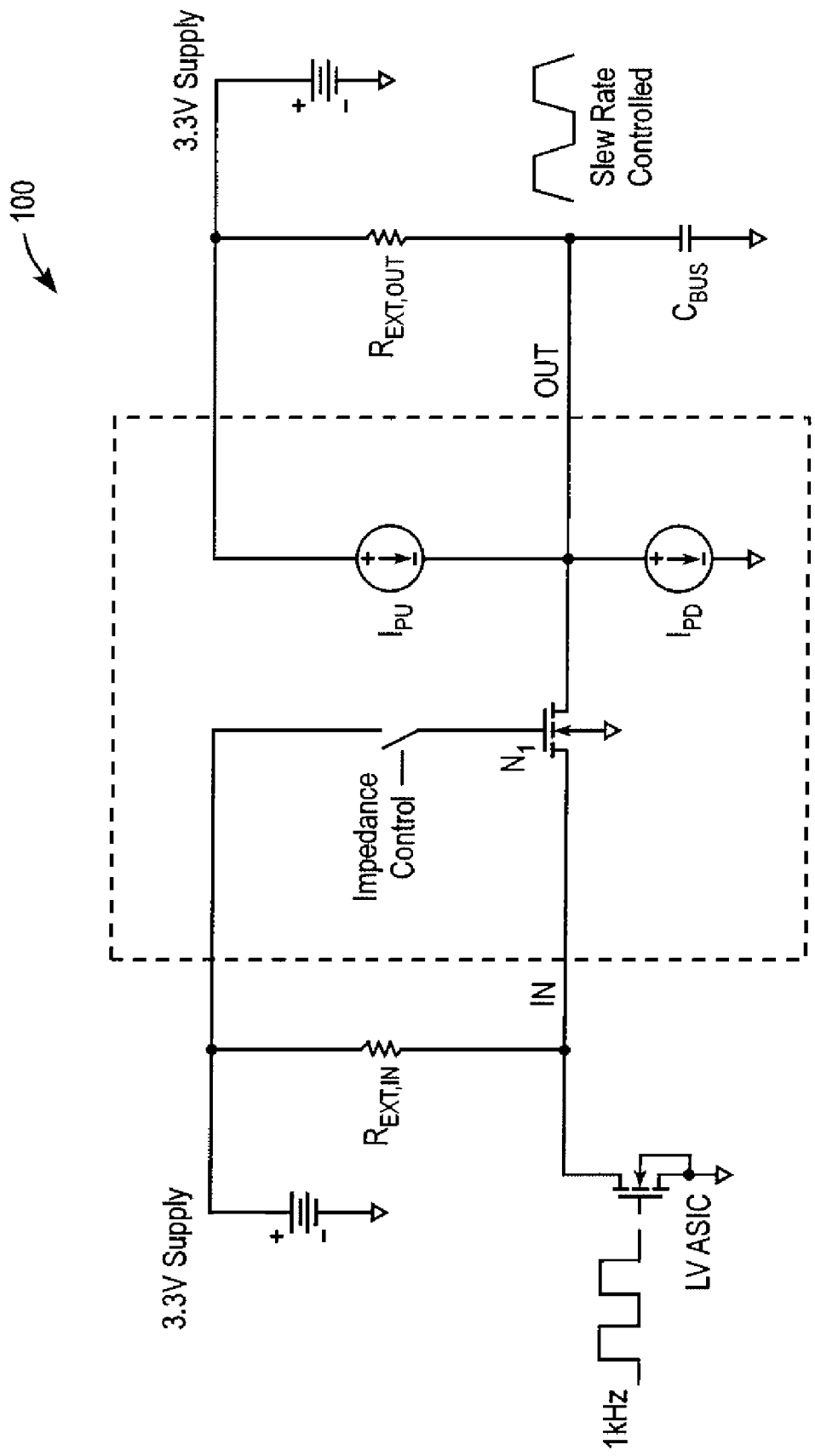
FIG. 1 illustrates a block diagram of the buffer according to the present invention.

FIG. 1 illustrates a block diagram of the buffer 100 according to the present invention in the boxed out section. The buffer 100 is preferably an ASIC, and in one particular embodiment is a circuit that complies with the HDMI specification. With respect to the HDMI implementation, it is relevant that the buffer 100 operates at 3.3 v voltage levels and that the signal, typically a 1 kHz signal, must have a rise time $\leq 50$ us and fall time $\leq 50$ us.

In one mode of operation, a 1 kHz signal, termed a forward signal herein, is input on the IN node, buffered within the buffer 100, and output as a slew rate controlled 1 kH signal on the OUT node. In another mode of operation, a reverse signal is input on the OUT node, buffered within the buffer 100, and then output onto the IN node. In the embodiment described herein this reverse signal is not slew rate controlled.

With respect to the circuit elements and blocks shown in FIG. 1, some bias must be applied to the "OUT" and "IN" nodes, which is done through resistors Rext,in and Rext,out, as shown. Further, the blocks labeled "IPU", "IPD", and "Impedance Control" are blocks with multiple transistors that perform functions as described further herein.

The following general overview of the above referenced circuit will first be provided, in conjunction with reference to the timing diagrams in FIG. 3. Thereafter, a more detailed explanation with respect to the circuit diagram of FIG. 2 will be provided. This particular embodiment is described for a circuit that operates having a 3.3 volt supply voltage and on a 1 kHz signal, although it will be apparent that the present invention can be implemented with other supply voltages and signals.

The following explanation is provided with respect to the forward signal at the transitions of that signal from high to low and low to high, which provide an understanding of how the circuit works.

HIGH→LOW Transition:

When the 1 kHz forward signal is "HIGH" on the buffer 100 the "IN" node is pulled to GND quickly. The "Impedance Control" block detects this, as well as, the "IPU" block. The "OUT" node that is being slew rate controlled needs this quick transition to GND offset. To do this the "Impedance Control" signal takes the gate of pass transistor N1 close to GND on the edge of the 1 kHz "HIGH" signal while "IPU" block sources current to keep the voltage on "OUT" at 3.3V. Now the 1 kHz forward signal is a steady state "HIGH" and the gate of N1 is slowly allowed to come back to its nominal voltage allowing current to flow through it to GND through the buffer 100 from "IPU" block creating a gradual HIGH→LOW transition on the "OUT" node.

LOW→HIGH Transition:

When the 1 kHz forward signal releases from its "HIGH" state on the buffer 100, the "IN" node is pulled "HIGH" via an external path which in this case is through the external resistor Rext,in. The "Impedance Control" block detects this, as well as the "IPD" block. This time however the "Impedance Control" block allows the gate of transistor N1 to drift slightly higher than nominal but for all intents and purposes transistor N1 is still "ON". While N1 is "ON" the "IPD" block sinks current to GND so that the "OUT" node is slew rate controlled, thus creating a gradual LOW→HIGH transition on the "OUT" node.

The following explanation is provided with respect to the reverse signal. In this mode of operation, there is not slew rate control. As such, during times in which the 1 Khz forward signal does not exist, there is no forward signal (or one also look at this as the low state of the 1 kHz forward signal). At such times, the reverse signal on the OUT node may be either high or low. The OUT's state will be dictated elsewhere by external circuitry not pertaining to this invention; however, buffer 100 must allow this "high" or "low" signal to be seen on the IN node, preferably at all times.

Figure 2:
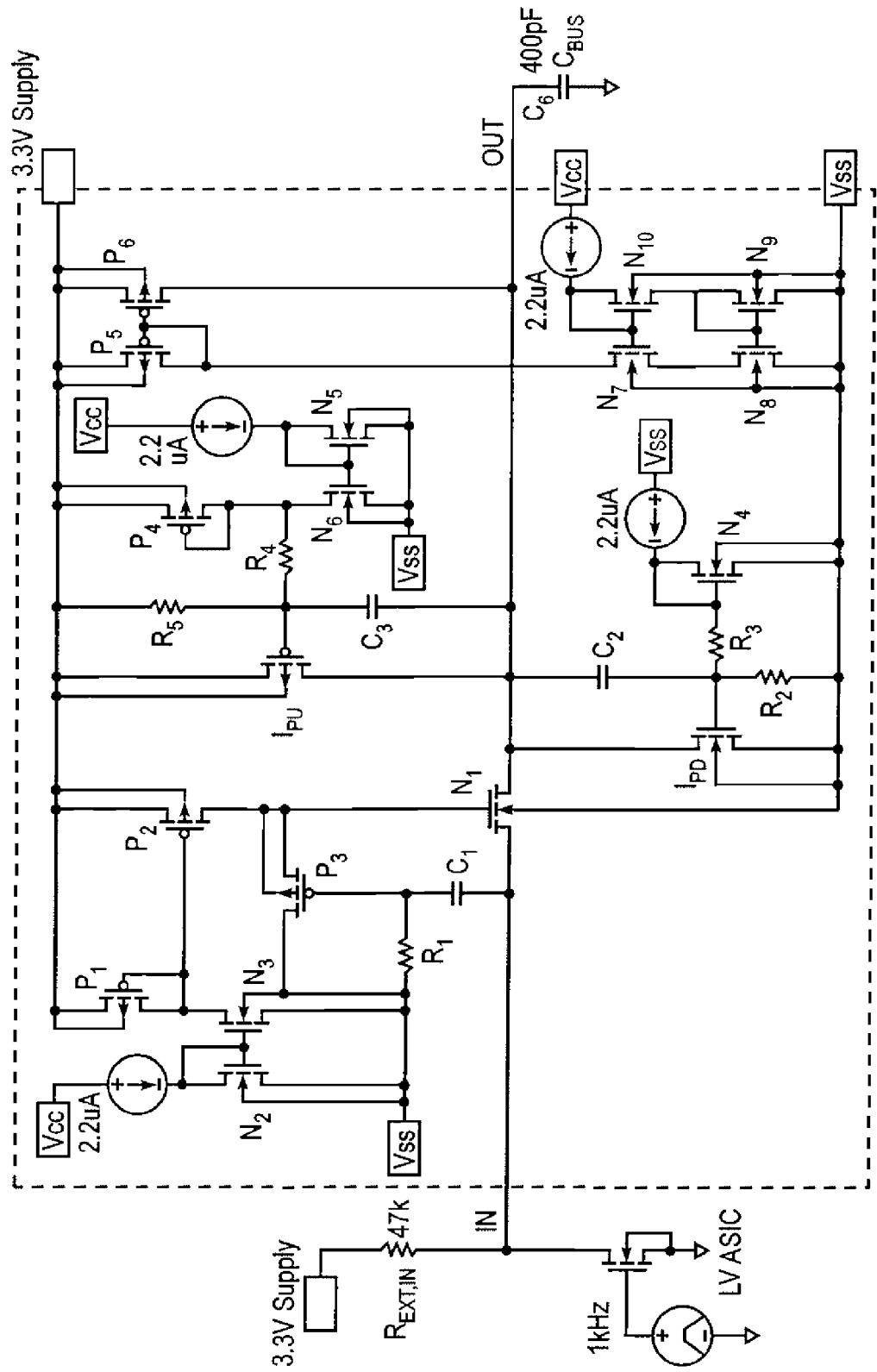
FIG. 2 illustrates a detailed circuit diagram of the buffer according to the present invention.

FIG. 2 illustrates a detailed circuit diagram of the buffer according to the present invention. Certain of the transistors shown are for simply biasing purposes so they are initially described:

1) N2, N3 and P1 provide a current mirror to develop a bias on P2.

2) A current source into N4 generates a Vt which is divided by 2 via R3 and R2 to develop a Vt/2 bias on the gate of IPD.

3) Similar to (2) N5, N6 and P4 are used as a current mirror to develop a diode drop off of the 3.3V Supply which is resistively divided by R4 and R5 to generate a (3.3-Vt/2) bias on the gate of IPU.

4) Transistors N7-N10 take a current source and ratio it up by 5:1, or even more preferably 10:1 so it can be used to bias the "OUT" node via P5 and P6. In a preferred embodiment, the value of this current source is set by the HDMI specification. The current source can be any value taking into account the MAX bus capacitance; which in the HDMI specification implementation is 1500 pF for a single CEC bus device. In a preferred implementation according to the present invention, there is used an internal current source of 12 uA, as well as a 10:1 ratio, to obtain the 120 uA value for the current source, per the HDMI specification. The operational description provided herein is similar to that for the forward and reverse signals. Given the further circuit detail, the description is more complex, but the functions are the same.

For the forward signal, the following description is provided.

HIGH→LOW Transition:

When the 1 kHz forward signal is "HIGH" on the buffer 100 the "IN" node is pulled to GND quickly. C1 "sees" this sudden transition and takes the voltage on P3 (originally at 0V) below GND turning it on hard. This pulls all the current from P2 through P3 to GND so the gate of N1 is at GND isolating the "IN" and "OUT" nodes. This is the case only for a brief time as the RC time constant (R1/C1) gradually allows the gate of P3 to go back to 0V and the gate of N1 to return back to it's nominal voltage of 1.8V. It is noted that while the gate of P3 being at GND does allow current to flow through it continually to GND but it is a very weak transistor so it can't sink all 2.2 uA, therefore, the gate of N1 will still have a bias on it. As the gate of N1 is slowly rising back to its nominal state C3 is "watching" the "OUT" node. As soon as it starts to get pulled down via the buffer 100, C3 pulls the gate of IPU down turning it on. This allows current to source through N1 through the buffer 100 to GND keeping the voltage up on "OUT". Again the RC time constant of C3/R5 gradually shuts off the IPU current source which allows a slow HIGH to LOW transition on the "OUT" node.

LOW→HIGH Transition:

When the 1 kHz forward signal releases from its "HIGH" state on the buffer 100, the "IN" node is pulled "HIGH" via an external resistor and the "OUT" via the internal current source. However, while this sequence of events is trying to occur, C2 is "watching" the "OUT" node, and as soon as it is pulled high (i.e. +400 mV transition), this is reflected on the gate of IPD so that it turns on and sinks some of the current that's trying to pull-up the "OUT" node. C2/R2 is a time constant as well so the gate of EPD gradually returns back to its normal state of Vt/2 which causes the "OUT" node to rise gradually as well.

For the reverse signal, the following description is provided. The OUT's state will be dictated elsewhere by external circuitry not pertaining to this invention; however, it preferably should allow this "high" or "low" signal to be seen on the IN node at all times. In this case, the pass transistor N1 will remain "ON" since there is no forward signal on the IN node triggering the time constant R1/C1. Furthermore, the steady state signal on the OUT node will not trigger C3/R5 or C2/R2 so Ipu and Ipd will remain OFF; therefore, the voltage on the OUT node will be allowed to dictate the voltage on the IN node with regards to a logic "low" and "high" state.

Modifications and variations of the preferred embodiment will be readily apparent to those skilled in the art. For instance, bidirectional slew rate control can be added, which then requires a directional control signal. Other such variations are within the scope of the present invention as defined by the claims.

What is claimed is:

1. A bidirectional buffer provided on an integrated circuit that provides slew rate control for a forward signal along with external resistive and capacitive elements comprising:
    a first node that functions as an input node for a forward signal and an output node for a reverse signal;
    a second node that functions as an output node for a forward signal and an input node for a reverse signal;
    a signal line disposed between the first and second node, with a pass transistor disposed thereon;
    a first circuit that provides impedance control to the forward signal when input onto the first node, the first circuit coupled to the first node and to at least one of the resistive elements;
    a second circuit that provides slew rate control of the forward signal output onto the second node, the second circuit coupled to the second node and to at least another one of the resistive elements and to the capacitive element.

2. The bidirectional buffer according to claim 1 wherein a slew rate control input is not provided.

3. The bidirectional buffer according to claim 1 wherein the first circuit includes a capacitor, a bias circuit, and a plurality of transistors that are coupled between the first node and a gate of the pass transistor.

4. The bidirectional buffer according to claim 3 wherein the bias circuit includes a current mirror.

5. The bidirectional buffer according to claim 1 wherein the second circuit includes a pull-down circuit, a pull-up circuit, and a current source circuit.

6. The bidirectional buffer according to claim 5 wherein the pull-down circuit includes a pull-down transistor, a first capacitor, and a plurality of resistors that are coupled to the second node.

7. The bidirectional buffer according to claim 6 wherein the pull-up circuit includes a pull-up transistor, a first capacitor, and a plurality of resistors that are coupled to the second node.

8. The bidirectional buffer according to claim 7 wherein the current source circuit biases the second node by a ratio of at least 5:1.

9. The bidirectional buffer according to claim 7 wherein a value of the current source is set by the HDMI specification.

10. The bidirectional buffer according to claim 5 wherein the current source circuit biases the second node by a ratio of at least 5:1.

11. The bidirectional buffer according to claim 5 wherein a value of the current source is set by the HDMI specification.

12. The bidirectional buffer according to claim 1 wherein the first circuit and the second circuit are substantially turned off and the pass transistor is turned on during a period when there exists the reverse signal.

13. A method of providing signal transmission through a bus on a buffer comprising the steps of:
 providing for a slew rate controlled forward signal through the bus on the buffer in a first direction, the slew rate controlled forward signal being provided without usage of any external control signal; and
 providing for a reverse signal through the bus on the buffer in a second direction, the second direction being opposite the first direction, thereby resulting in a bi-directional bus with slew rate control in at least one direction.

14. The method according to claim 13 wherein transitions of the forward signal are either pulled-up or pulled-down to decrease a period of the transitions.

* * * * *